(12) United States Patent
Wang et al.

(10) Patent No.: US 6,959,066 B2
(45) Date of Patent: Oct. 25, 2005

(54) DEVICE FOR PROGRAMMABLE FREQUENCY DIVIDER

(75) Inventors: Jung-Chih Wang, Taipei (TW); Chao-Yu Hu, Chiai (TW)

(73) Assignee: Elan Microelectronics Corp., Hsin-Chu (TW)

( * ) Notice: Subject to any disclaimer, the term of this patent is extended or adjusted under 35 U.S.C. 154(b) by 15 days.

(21) Appl. No.: 10/392,910

(22) Filed: Mar. 21, 2003

(65) Prior Publication Data

US 2003/0184350 A1 Oct. 2, 2003

(30) Foreign Application Priority Data

Mar. 28, 2002 (TW) ...................................... 91203850 U

(51) Int. Cl.$^7$ ........................................... H03K 21/00
(52) U.S. Cl. ....................................................... 377/47
(58) Field of Search .......................................... 377/47

(56) References Cited

U.S. PATENT DOCUMENTS 6,084,484 A * 7/2000 Chang et al. ................. 331/75

OTHER PUBLICATIONS

Tro H. Nagle, "An Introduction to Computer Logic", 1975, Prentice–Hall, pp. 236–238.*

* cited by examiner

*Primary Examiner*—Margaret R. Wambach
(74) *Attorney, Agent, or Firm*—Troxell Law Office PLC

(57) ABSTRACT

The present invention relates to a programmable frequency divider having one n-bit adder and one n-bit D Flip Flop. These are used to transform the import clock to the target clock. The adder takes one adjustment parameter and one return signal as a basis to create the first output signal, with the possibility to program the adjustment parameter. The D Flip Flop and the adder create a cycle, which is used to receive the first output signal and its import clock to create the second output signal. The second output signal is separated into a return signal and the target signal. The D Flip Flop sends the return signal back to the adder, which will make addition calculations under the adjustment parameter, finally giving out the target clock with the target signal as a calculation basis.

10 Claims, 8 Drawing Sheets

DEVICE FOR PROGRAMMABLE FREQUENCY DIVIDER

FIELD OF THE INVENTION

The present invention relates to a frequency divider, in particular to a programmable frequency divider in which an adjustment parameter is controlled by a program command.

BACKGROUND OF THE INVENTION

In digital systems with corresponding clock speed rates, a clock signal plays a very important role, besides determining the performance of the system, it is closely related to an electricity usage. Since mobile solutions are popular, most PC CPUs, digital signal processors (DSP) and miniature controlling units have steadily lowered their power consumption to achieve a goal of saving electricity. During times of inactivity of the controlling units, the system is switched to a state of a lower work frequency.

For normal traditional frequency dividing installations, please refer to FIG. 1A. It usually comprises one n-bit D Flip Flop (DFF) together with one adder. This structure gives a different frequency signal after the frequency lowering process, which is then imported into the D Flip Flop. For this means, the system also has to make use of a multiplexer, which uses the control signal FREQ_SEL to select the target frequency signal, then outputs this target frequency signal. During the layout, the positions of each D Flip Flop are different; therefore the process of transporting output to the multiplexer often produces different delays. At the same time, when the frequency selecting control signal FREQ_SEL changes the frequency, because the control signals arrive at different times, short change to a frequency differing from the target frequency takes place. Naturally, over a period of time the signal will eventually change to the target signal, but under certain circumstances, this could have a large impact on the procedures. As an example, please refer to the clock diagram of FIG. 1B. At a time of approximately 215 ns, the control signal FREQ_SEL has three bits changed from ¡§000¡" to ¡§011¡". Because the delays of the three bits, the FREQ_SEL signal do not correspond, the FREQ_SEL first changes from ¡§000¡" to ¡§010¡", then , 0.2 ns later, it changes to a stable position of ¡§011¡". Thus is causes the CLKOUT to create a tiny pulse signal, which is also called a glitch signal. Because of this, the system might take false actions.

For another type of a traditional frequency divider, please refer to the binary up counter on FIG. 2A. Any possible number of cycles can be used for the input COUNT_TO, as well as making use of it's a count to flag (TERCNT), and at the determined COUNT time, a CLKIN cycle pulse signal will be created. As shown on FIG. 2B, if this pulse signal is used as a clock, it has a disadvantage that the duty cycle produced is not necessarily 50%—50%, furthermore there is the possibility of an occurrence of a glitch signal.

The programmable frequency divider presented by this invention makes use of the method of controlling the input adjustment parameters, which can result in a clock frequency divided by $2^m$ (with m being a integer of zero or above), with no possibility of an occurrence of an clock glitch signal, thus providing a lower working clock for the controlling unit.

SUMMARY OF THE INVENTION

The main object of the present invention is to provide a programmable frequency divider, which has programmable controls (direct use of the programmable command to change the frequency) to reach the goal of the frequency dividing. Furthermore, the present invention provides a programmable frequency divider, which outputs different multipliers of frequency dividing clock signals from the same output point. There is therefore no need for the choice signal of the multiplexer to remove the possibility of a clock glitch signal. Thus a stable, energy saving working condition is created.

A further object of the present invention is to provide a programmable frequency divider without causing the occurrence of a clock glitch signal.

A third object of the present invention is to provide a programmable frequency divider for clock with a duty cycle of 50%—50%.

The present invention relates to a programmable frequency divider, comprising one n-bit adder and one n-bit D Flip Flop, which are used to transform one import clock to one target clock, with the import clock having an frequency $2^m$ times as high as that of the target clock, with m being a integer larger than zero. The given adder takes one adjustment parameter and one return signal as a basis to create one first output signal, wherein the adjustment parameter contains n bits, with n being a integer larger than zero, and with $m \leq n$, and with the possibility to program the given adjustment parameter. The given D Flip Flop and said adder create a cycle, which is used to receive the first output signal and its given import clock, thus creating the second output signal. The second output signal comprises a return signal and the target signal. This target signal is build of the most significant bit of the second output signal, while the return signal consists of all bits from the second output signal; furthermore, the D Flip Flop sends the return signal back to the adder, which will make addition calculations under the given adjustment parameter, finally giving out the target clock with the target signal as a calculation basis.

BRIEF DESCRIPTION OF THE DRAWINGS

The present invention may best be understood through the following description with reference to the accompanying drawings, in which.

Figure 1A:
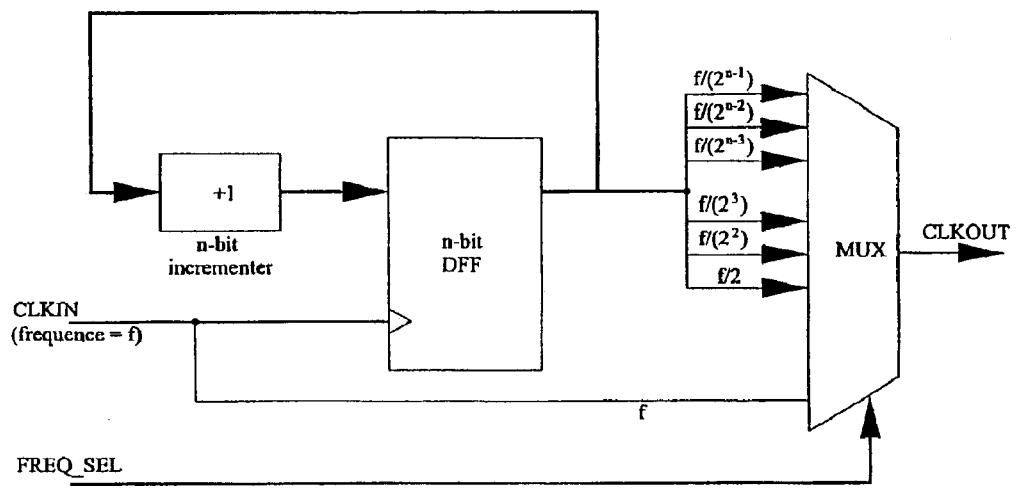
FIG. 1A and FIG. 2A are diagrams of traditional frequency dividers.
Figure 1B:
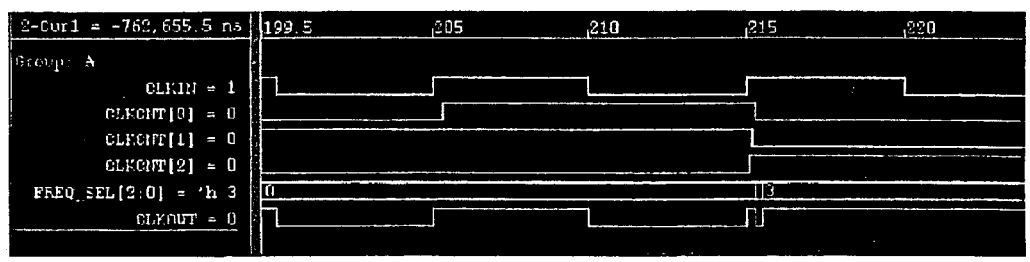
FIG. 1B and FIG. 2B are clock diagrams of the frequency dividers described in FIG. 1A and FIG. 2A, respectively.
Figure 2A:
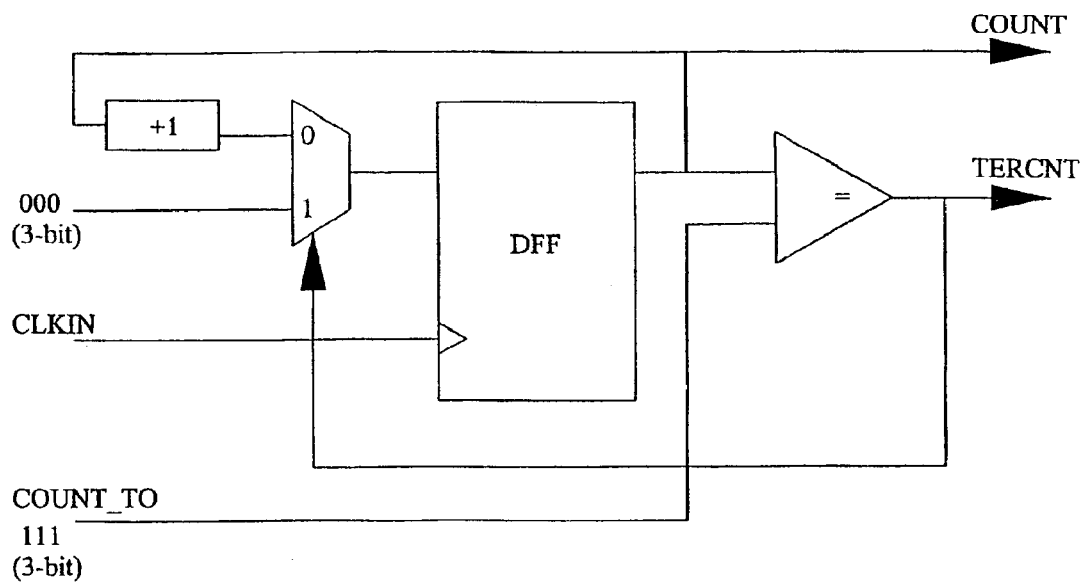
Figure 2B:
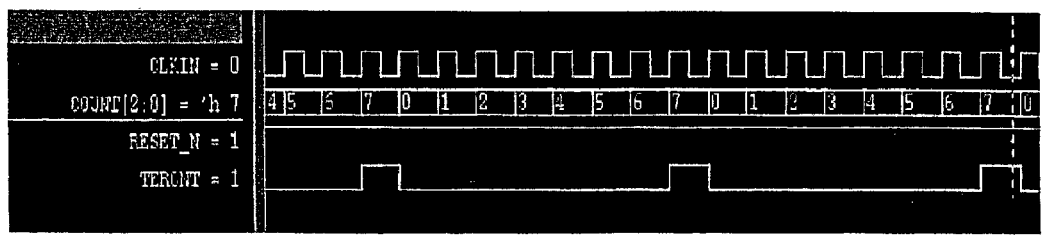

Table 1 is a table of the relation between the frequency f and the INCR adjustment parameter of the present invention; and Table 2 is a table of the relation of the 7-bit INCR adjustment parameter with the divided frequency multiplier in another practical example of the present invention.

DETAILED DESCRIPTION OF THE PREFERRED EMBODIMENT

To help the present invention to achieve the above mentioned objectives, all necessary techniques, methods and concrete structural features are described below in a practical example. To further improve the understanding, in the following, the present invention is described in detail with reference to the included pictures.

The present invention provides a programmable frequency divider, which is used to transform one import clock (an oscillator can be used to create said import clock) to one target clock. The frequency of the said import clock is $2^m$ times of the target clock frequency, with m being an integer larger than zero. Please refer to FIG. 3A, the displayed structure comprising: one n-bit adder 31 and one n-bit D Flip Flop 32. The n-bit D Flip Flop 32 means the inputs of D Flip Flop have n-bits and the clock pulse. One adjustment parameter 301 and one return signal 302 are used together to create one first output signal 303 with the adjustment parameter including n bits, with n being a integer larger than zero, and $m \leq n$ (for example, when the adjustment parameter is n bit, the frequency divider is $2^n$), with the possibility of using the method of program commands that control said adjustment parameter 301. The D Flip Flop 32 and said adder 31 create a cycle, used to accept the first output signal 303 and the import clock 300, thus creating one second output signal 304; said second output signal 304 is furthermore divided into one return signal 302 and one target signal 399. The structure of the target signal 399 comprises the most significant bit of the second output signal 304, while the structure of the return signal 302 comprises all bits from the second output signal 304. Said return signal 302 is transmitted through the cycle to said adder 31, where it is incremented with the adjustment parameter 301, to output the target clock through use of the target signal 399. In an ideal example, the D Flip Flop used by the present invention comprises one positive edge trigger Flip Flop or one negative edge trigger Flip Flop. Furthermore, said D Flip Flop or said adder consists of at least one AND Gate, at least one OR Gate and at least one NOT Gate. Please note that the D Flip Flop in this example is used as a temporary data storage unit. When the temporary data storage unit provided by the present invention is triggered by the clock CLKIN, the output date is updated. Other temporary data storage units are able to execute similar functions, for example D Flip Flops, and electrical current interrupters created by temporary storage devices can each make use of the present invention.

Therefore, the present invention provides a programmable frequency divider, which has programmable controls (direct use of the program commands to change the frequency) to reach the goal of the frequency dividing. Furthermore, the present invention provides a programmable frequency divider, which outputs different multipliers of frequency dividing clock signals from one and the same output point. There is therefore no need for the choice signal of the multiplexer to remove the possibility of a clock glitch signal. Thus a stable, energy saving working condition is created.

Figure 3A:
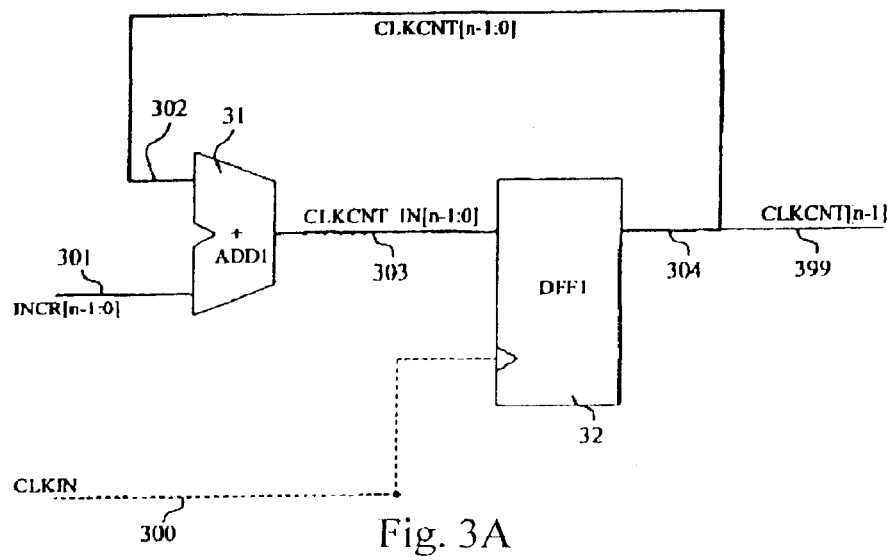
FIG. 3A is a diagram of a practical example of the frequency divider described by the present invention.
Figure 3B:
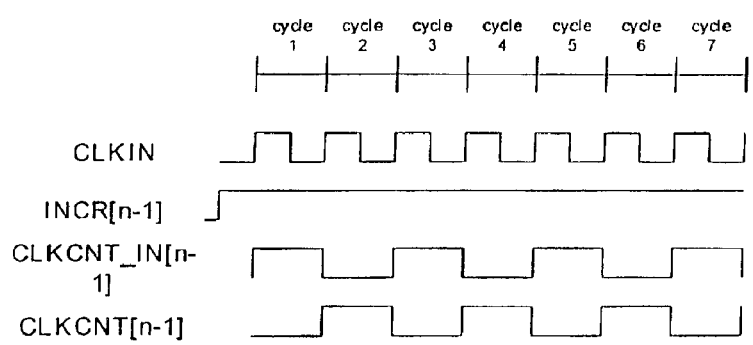
FIG. 3B to FIG. 3D are clock diagrams of the various multipliers for frequency divisions by the frequency divider described in FIG. 3A.

To take an example, please refer to FIG. 3A and FIG. 3B. While the used INCR adjustment parameter 301 (with n bits, n being a number in the range between 0 to n−1) is eliminated the most significant bit, and the remaining bit set as i§0i", if at first the CLKCNT[n−1] target signal 399 is set as i§0i", and the ADD1 adder 31 calculations are finished, because the most significant bit of the used INCR adjustment parameter 301 is set to i§1i" and the remaining bit is set to i§0i", so the ADD1 adder 31 outputs the CLKCNT_IN [n−1] first output signal 303 i§1i". This is the first cycle (cycle 1). After the positive edge trigger of the next clock cycle is given, the CLKCNT[n−1] target signal 399 is updated to i§1i" (this being the second cycle, cycle 2). After the CLKCNT[n−1:0] return signal 302 and the INCR adjustment parameter 301 are joined in the ADD1 adder, the CLKCNT_IN[n−1] first output signal 303 is set as i§0i", caused by carrying a number. In the third cycle (cycle 3), the CLKCNT[n−1] target signal 399 is updated to i§0i", therefore returning back to its original state. If there is no change in the import of the INCR adjustment parameter 301, the CLKCNT[n−1] target signal 399 will each cycle switch from i§0i" to i§1i" or from i§1i" to i§0i". Therefore the CLKCNT[n−1] target signal 399 can achieve a doubled frequency output clock, with the output diagram of the target clock shown as FIG. 3B.

Figure 3C:
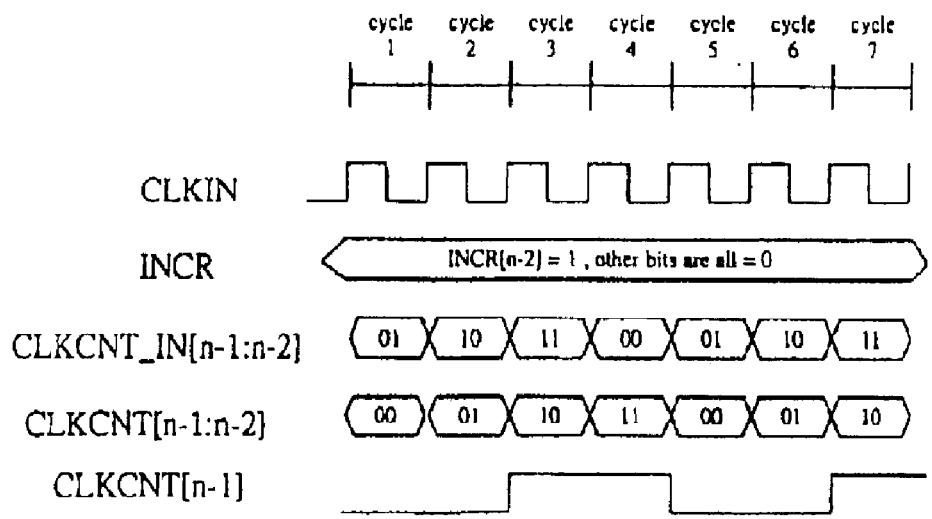

Furthermore, please refer to the clock diagrams of FIG. 3A and FIG. 3C. If the import of the INCR adjustment parameter 301 (with n bits, n being a number in the range between 0 to n−1) is changed, so that the second significant bit of INCR[n−2] of this adjustment parameter 301 is set to i§1i" and the remaining bit is set to i§0i", after applying the frequency dividing function of the present invention and on the basis that the i§1i" of the INCR adjustment parameter 301 is on the position of the n−2 bit (second significant bit), the CLKCNT return signal 302 is to be added two times up to let the CLKCNT[n−1] target signal 399 switch once from i§0i" to i§i" or from i§1i" to i§0i". This way we can receive a CLKCNT[n−1] target signal 399 achieving a $2^2$ multiplier frequency clock, as shown on FIG. 3C.

Figure 3D:
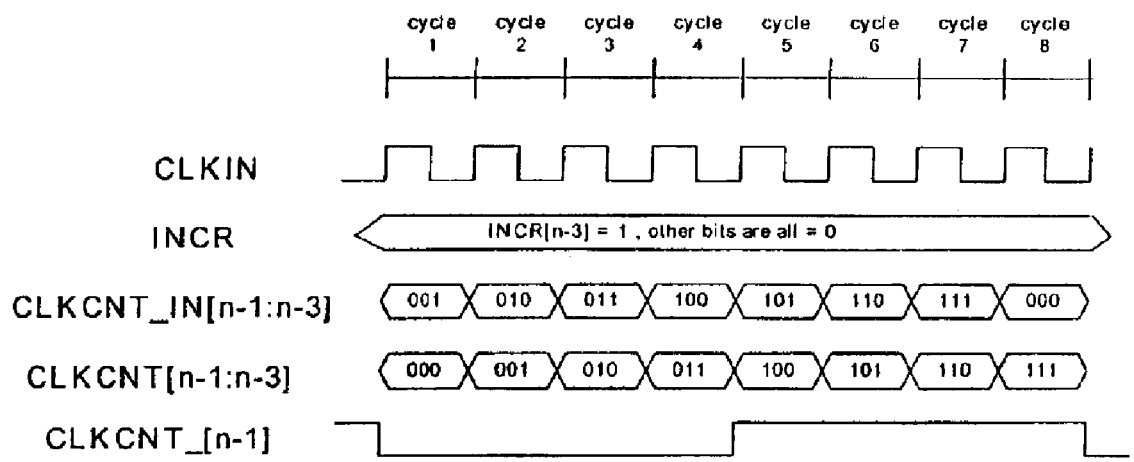

To go positive edge one step further, please refer to FIGS. 3A and 3D. If the n−3 bit (third significant bit) of the INCR[n−3] adjustment parameter 301 is set to i§1i" and the remaining bits are set to i§0i", on the basis that the i§1i" of the INCR adjustment parameter 301 is on the position of the n−3 bit, the CLKCNT return signal 302 is to be added four times up to let the CLKCNT[n−1] target signal 399 switch once from i§0i" to i§1i" or from i§1i" to i§0i". This way we can receive a CLKCNT[n−1] target signal 399 achieving a $2^3$ multiplier frequency clock, as shown on FIG. 3D.

Therefore, through use of the appropriate import value to control the INCR adjustment parameter 301, we can use the n−m bit of the INCR[n−m] adjustment parameter 301 with its value set to i§1i" (with m=1, 2, 3, ¡K, n) and the remaining bits of the INCR adjustment parameter 301 set to i§0i" to receive a CLKCNT[n−m] target signal 399 achieving a $2^m$ multiplier frequency clock. The adjustment parameter INCR and the frequency f are displayed in table 1.

Figure 4A:
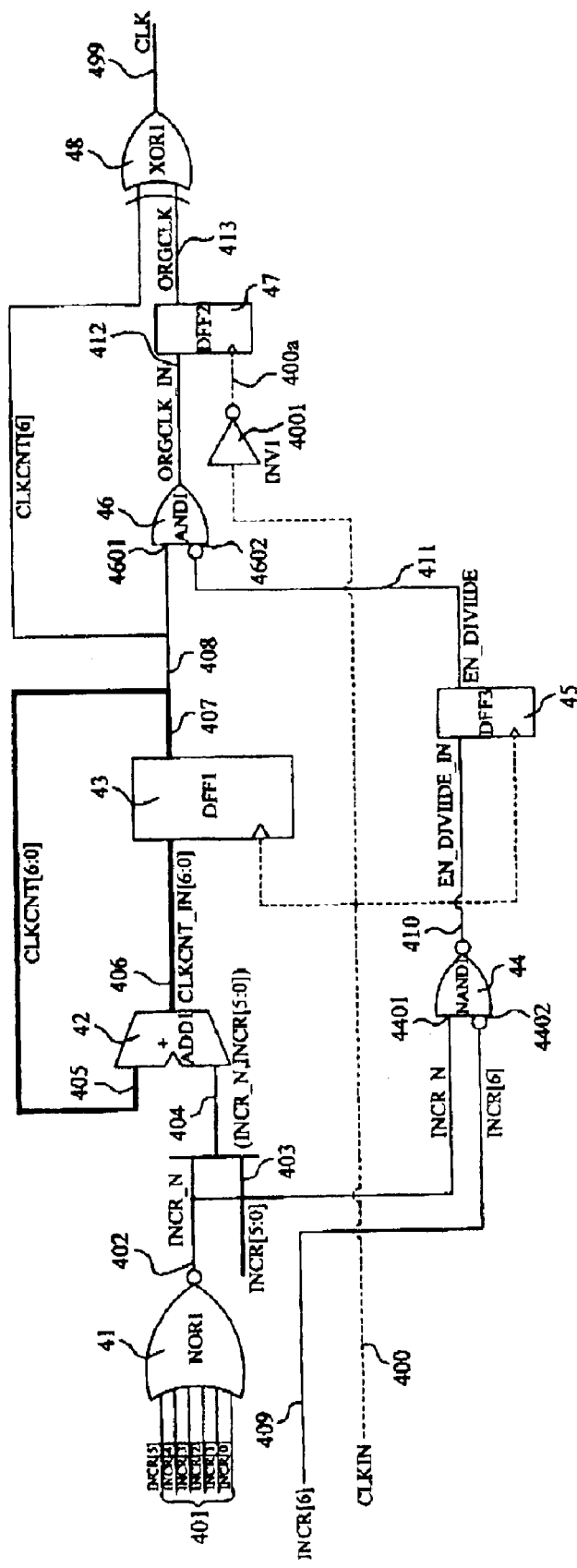
FIG. 4A is a diagram of another practical example of the frequency divider described by the present invention; and FIG. 4B to FIG. 4F is clock diagrams of the various multipliers for frequency divisions by the frequency divider described in FIG. 4A.

Please refer to the second ideal example described in FIG. 4A. The present invention provides a programmable frequency divider, which is used to transform one import clock (an oscillator can be used to create said import clock) to one target clock. The frequency of the said import clock is $2^m$ times of the target clock frequency, with m being an integer larger than zero, used to achieve the goal of dividing the frequency. The device described in the present invention comprises: one NOR Gate 41, one n bit adder 42, one n bit first D Flip Flop 43, one NAND Gate 44, one second D Flip Flop 45, one AND Gate 46, one third Flip Flop 47 and one XOR Gate 48. The import of the NOR Gate 41 forms the structure of the remaining bit after the elimination of the most significant bit of the adjustment parameter 401. After passing the logic calculations of the NOR Gate 41, one output signal 402 is generated. The adjustment parameter in this case contains n bits, with n being a integer larger than zero, and $m \leq n$ (for example, if the adjustment parameter includes n bit, the highest divided frequency multiplier is $2^n$). The adjustment parameter gives furthermore the possibility of programmable controls. The adder 42 takes the first signal 404 and one return signal 405 to create one first output signal 406, with said first signal 404 consisting of said output signal 402 of the NOR 41 and the structure of the remaining bits after the elimination of the most significant bit of the adjustment parameter 403, in which structure the said output signal 402 acts a the most significant bit of the first signal 404. The first D Flip Flop 43 and said adder 42 form a cycle, used to take in the import clock 400 and the first output signal 406 generated by said adder 42, thus creating the second output signal 407. This second output signal 407 can be separated into one second signal 408 and one return signal 405, with the second signal 408 acting as the most significant bit of the second output signal 407. The return signal 405 consists of the remaining bits of the structure of the second output signal 407. Said return signal 405 is send back to the adder 42, where it makes addition calculations with the first signal 404. NAND Gate 44 generates one fourth output signal 410 on the basis of the first import 4401 and the second import 4402. Said first import 4401 is used to receive the output signal 402, while said second import 4402 acts as inverse import, used to receive the Most significant bit of the adjustment parameter 409. That is, said most significant bit of the adjustment parameter 409 has first to undergo inverse calculations before being sent to the NAND Gate 44. The second D Flip Flop 45 is used to receive the fourth output signal 410 and the import clock 400 to create the third signal 411. The AND Gate 46 generates one fifth output signal 412 on the basis of the third import 4601 and the fourth import 4602. Said third import 4601 is used to receive the second signal 408, while said fourth import 4602 acts as inverse import, used to receive the third signal 411. That is, said third signal 411 has first to undergo inverse calculations before being send to the AND Gate 46. The third Flip Flop 47 is used to receive the fifth output signal 412 and the inverse import clock 400a to create the fourth signal 413. The said inverse import clock 400a makes use of the NOT Gate 4001 to import said import signal 400 after the inverse calculations into the Flip Flop 47. The XOR Gate 48 generates one target signal 499 on the basis of said second signal 408 and said fourth signal 413, and on the basis of said target signal 499 the target clock is generated. In an ideal example, the D Flip Flop used by the present invention consists of either one positive edge trigger Flip Flop or one negative edge trigger Flip Flop. Furthermore, said D Flip Flop or said adder consists of at least one AND Gate, at least one OR Gate and at least one NOT Gate. Please note that the D Flip Flop in this example is used as a temporary data storage unit. Therefore, the present invention provides a programmable frequency divider, which has programmable controls (direct use of the program commands to change the frequency) to reach the goal of the frequency dividing. Furthermore, the present invention provides a programmable frequency divider, which outputs different multipliers of frequency dividing clock signals from one and the same output point. There is therefore no need for the choice signal of the multiplexer to remove the possibility of a clock glitch signal. Thus a stable, energy saving working condition is created.

Figure 4B:
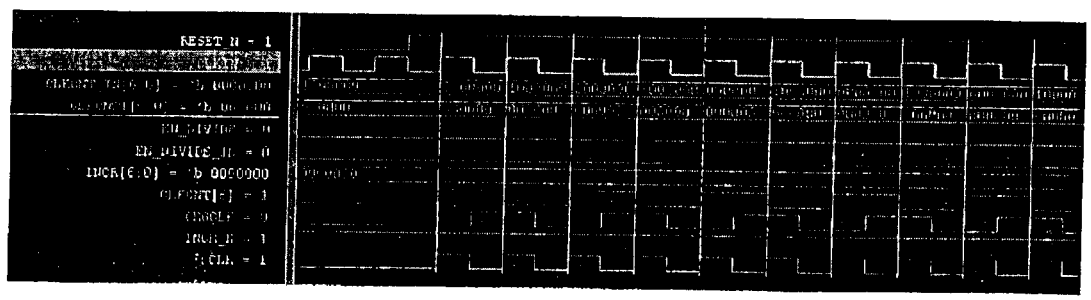

To take an example, one seven bit adjustment parameter can take a multiplier frequency of $2^0$~$2^7$. If, for example, you take a multiplier frequency of $2^0$ (with the output clock frequency the same as the import clock), please refer to FIG. 4A and FIG. 4B. The seven bits of the import INCR adjustment parameter are ¡§0000000¡". During the first cycle (cycle 1), the remaining bits after the most significant bit has been send out from the INCR[5:0] adjustment parameter 401 go through NOR1 41 calculations to create the INCR_N output signal 402 with a value of ¡§1¡". If at first the CLKCNT[6] second signal 408 is ¡§0¡", then said adder 42 outputs the CLKCNT_IN[6] first output signal 406 with a value of ¡§1¡". In this case no transfer can be created. On the next positive edge triggered CLKIN import signal 400, the CLKCNT[6] second signal 408 will be updated to ¡§1¡" and it enters the second cycle (cycle 2). This time, the CLKCNT [6] second signal 408 is ¡§1¡", and after the return signal 405 and the first signal 404 have been added, the CLKCNT_IN[6] first output signal 406 will produce a transfer and change to ¡§0¡". On the next positive edge triggered CLKIN import signal 400, the CLKCNT[6] second signal 408 will be updated to ¡§0¡" and thus return to its original state. It can be concluded, that if the adjustment parameter does not change, the CLKCNT[6] second signal 408 will in each cycle switch from ¡§0¡" to ¡§1¡" or back again, which equals a clock frequency of f/2. When the bits of the INCR[6:0] adjustment parameter stay at ¡§0000000¡", but the INCR_N output signal 402 has a value of ¡§1¡" and the most significant bit of the INCR[6] adjustment parameter 409 is ¡§0¡", after going through the NAND1 44 calculations, the EN_DIVIDE_IN fourth output signal 410 becomes ¡§0¡". Therefore after the next positive edge trigger of the import clock 400 through the second DFF3 Flip Flop 45 the output EN_DIVIDE third signal 411 has to stay continuously at ¡§0¡". This time, the ORGCLK_IN fifth output signal 412 equals the CLKCNT[6] second signal 408 (The other import 4602 of the AND 46 is ¡§1¡"). The DFF2 third Flip Flop 47 makes use of the negative edge trigger of the CLKIN import clock 400, thus, with regards to the two imports of the XOR1 48, the ORGCLK fourth signal 413 delays the CLKCNT[6] second signal 408 of the CLKIN import clock 400 for one half cycle. After the XOR-calculations in the XOR1 Gate 48, the target signal 499 can be generated to receive the target clock of the frequency f. For the changes of the clock signal please refer to FIG. 4B. The two imports of the XOR1 Gate 48 miss half a cycle (CLKIN cycle), therefore it is not possible, that the output signals create a glitch. Furthermore they can achieve a divided frequency clock with a duty cycle of 50%—50%.

Figure 4C:
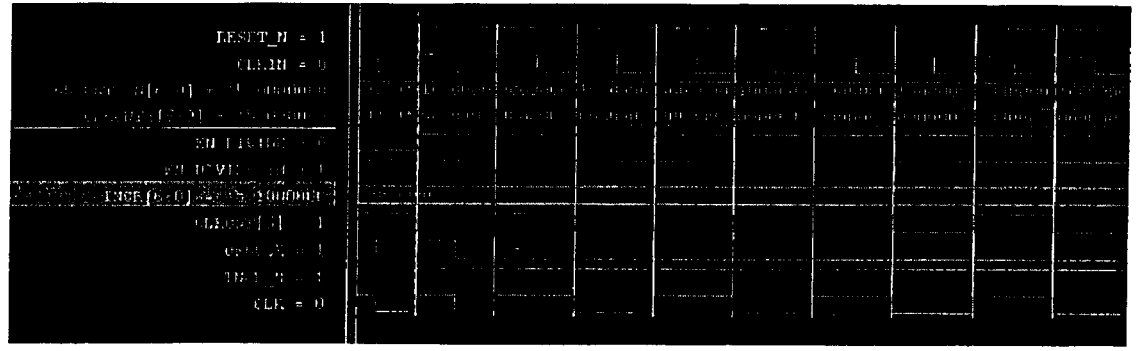
Figure 4D:
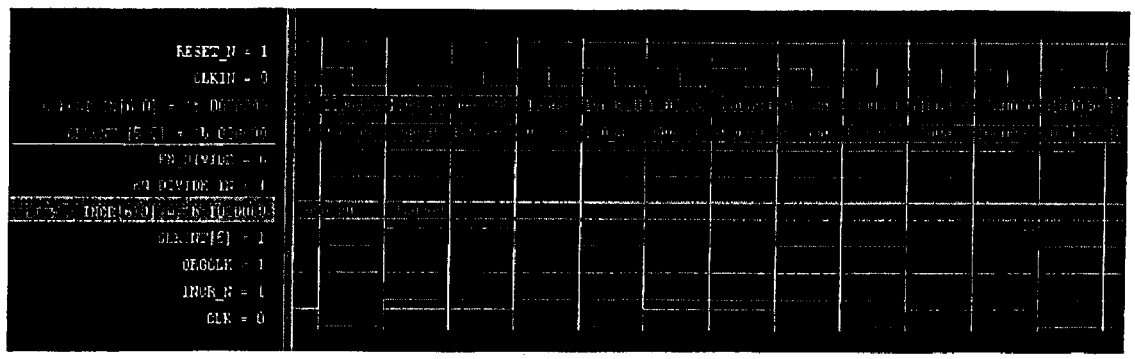
Figure 4E:
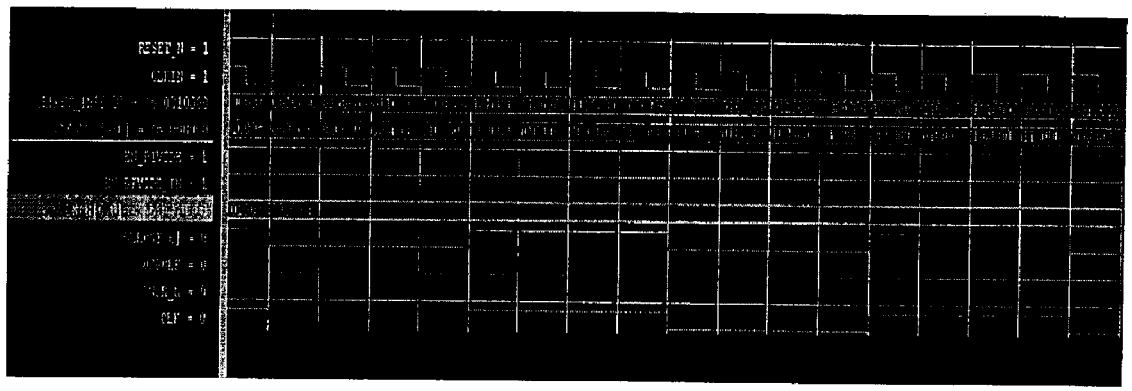
Figure 4F:
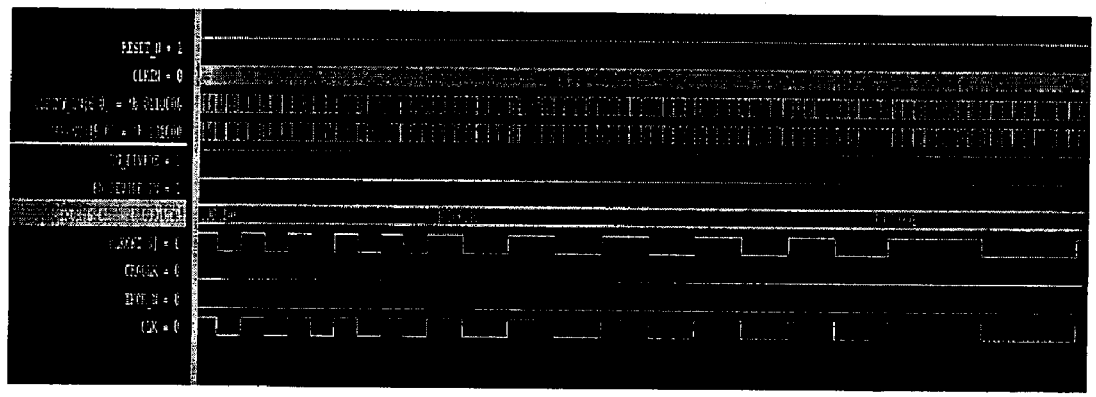

If you take a multiplier frequency of $2^1$, please refer to FIG. 4A and FIG. 4C. This represents a model with frequency divided through the multiplier 2. The seven bits of the import INCR adjustment parameter are ¡§1000000¡". During the first cycle (cycle 1), the remaining bits after the most significant bit has been send out from the INCR[5:0] adjustment parameter 401 go through NOR1 41 calculations to create the INCR_N output signal 402 with a value of ¡§1 ". If at first the CLKCNT[6] second signal 408 is ¡§0¡", then the return signal 405 and the first signal 404 are added up to set the value of the CLKCNT_IN[6] first output signal 406 to ¡§1¡". In this case no transfer can be created. On the next positive edge triggered CLKIN import signal 400, the CLKCNT[6] second signal 408 will be updated to ¡§1¡" and it enters the second cycle (cycle 2). This time, the CLKCNT [6] second signal 408 is ¡§1¡" and after going through the calculations of the adder 42 the CLKCNT_IN[6] first output signal 406 will produce a transfer and change to ¡§0¡". On the next positive edge triggered CLKIN import signal 400, the CLKCNT[6] second signal 408 will be updated to ¡§0¡" and thus return to its original state. This is the same as in the example mentioned above (with the output clock frequency the same as the import clock). It can be concluded, that if the adjustment parameter does not change, the CLKCNT[6] second signal 408 will in each cycle switch from ¡§0¡" to ¡§1¡" or back again, which equals a clock frequency of f/2. When the bits of the INCR[6:0] adjustment parameter stay at ¡§1000000¡", but the INCR_N output signal 402 has a value of ¡§1¡" and the most significant bit of the INCR[6] adjustment parameter 409 is ¡§1¡", after going through the NAND1 Gate 44 calculations, the EN_DIVIDE_IN fourth output signal 410 becomes ¡§1¡". Therefore after the next positive edge trigger of the import clock 400 through the DFF3 second Flip Flop 45 the output EN_DIVIDE third signal 411 has to stay continuously at ¡§1¡". After the inverse import 4602 is imported into the AND1 Gate 46, it causes the ORGCLK_IN fifth output signal 412 to stay continuously at ¡§0¡". At this time, the ORGCLK fourth signal 413 generated by the DFF2 third Flip Flop at a permanent value of ¡§0¡". Therefore, after going through the logic calculations of the XOR1 Gate 48, the CLK target signal 499 equals the CLKCNT[6] second signal 408 going directly through the XOR1 Gate 48, thus the CLK target signal 499 can reach a target clock frequency of f/2. Please do also refer to the clock diagram of FIG. 4C.

To go even one more step further, if you take a multiplier frequency of $2^2 \sim 2^7$, please refer to FIG. 4A, FIG. 4D, FIG. 4E and FIG. 4F. For any other model than those described above, the seven bits for the relations between the INCR adjustment parameter and the frequency dividing multipliers can be seen in table 2. This time, the INCR_N output signal 402 holds a value of ¡§0¡", the EN_DIVIDE_IN fourth output signal 410 is ¡§1¡". This lets third signal 411 after the second cycle also become ¡§1¡". This time, no matter how the CLKCNT[6] second signal 408 changes, the ORGCLK_IN fifth output signal 412 will become ¡§0¡". Half a cycle later, the ORGCLK fourth signal 413 will permanently become ¡§0¡". Therefore, the CLK target signal 499 is finished determining the CLKCNT[6] second signal 408. Afterwards, in the cycle created by the DFF1 first Flip Flop 43 and the ADD1 adder 42, when the $2^2$ multiplier frequency is divided, we can see in table 2 that the value for the INCR[6:0] adjustment parameter is ¡§0100000¡". The first signal 404 of the ADD1 adder import {INCR_N, INCR[5:0]} equals the INCR[6:0] adjustment parameter in every bit. At that time, for every cycle that the electrical current has passes the CLKIN import clock 400, the CLKCNT return signal 405 increases the total value of the bits of the INCR[6:0] adjustment parameter by one. Therefore, the values for the highest and the second significant bit of the CLKCNT[6:5] second output signal 407 can make changes by taking the two bit values of ¡§00¡", ¡§01¡", ¡§10¡ and ¡§11¡ in the given command. This time, the CLKCNT[6] second signal 408 ch every second cycle of the import clock 400 (CLKIN cycle) once from ¡§0¡ to ¡§1¡ or from ¡§1¡" to ¡§0¡". Therefore, every four cycles of the import clock 400 (CLKIN CYCLE), one end of the XOR1 48 creates one complete clock signal, with a frequency of f/4. To conclude the above mentioned statements, the CLK target signal 499 now outputs a complete determining of the CLKCNT[6] second signal 408, therefore the CLK target signal 499 reaches a target clock of f/4, as can be seen on FIG. 4D. At the same time we can conclude, that with the INCR[6:0] adjustment parameter set at ¡§0010000¡", the CLKCNT[6] second signal 408 will change once every four import clock cycles (CLKIN cycle) from ¡§0¡" to ¡§1¡" or from ¡§1¡" to ¡§0¡". Therefore, every eight cycles of the import clock (CLKIN cycle), one end of the XOR1 Gate 48 creates one complete clock signal, with a frequency of f/8, as can be seen on FIG. 4E. The remaining models can be used in the same way, the results are shown on FIG. 4F.

Because of these features, the present invention can be extended indefinitely through the $2^n$ multiplier signals to meet the requirements of any system. Output signals of different frequency are most significant bits with the Flip Flop. Thus while changing the frequency, the output clock signal will not be able to create a glitch. The electrical current of the present invention can completely make use of a logic gate level digital electrical current and especially fits the HDL High-Level Design Flow. Besides of this, the present invention also has the speciality of a programmable control for the changes in the parameters. It is therefore especially useful in controlling units, which can directly use the program control code to change the working frequency of the relevant digital system. Therefore, in the design of digital systems, there are not many limitations for the wide uses of this product. To sum up the above mentioned, the present invention of a ¡§programmable frequency divider¡" is a rational and complete invention, not only with excellent usability, but also of innovative design. The present invention can completely make use of a logic gate level digital electrical current to reach the function of frequency dividing. This invention is a breakthrough for the current technology.

The present invention is inventive, innovative and progressive. It fulfils in every aspect the requirements for the application for a new patent and the patent can thus be applied for. It should include all variations and versions covered by the present invention, including possible minor improvements and more exact definitions. The above mentioned practical examples are used to describe the invention in more detail, they should therefore be included in the range of the invention, but should not restrict the invention in any way.

TABLE 1

Table of the relation between the frequency f and the INCR adjustment parameter

| N bit adjustment parameter | | | | | | | | | divided frequency |
|---|---|---|---|---|---|---|---|---|---|
| n-1 | n-2 | n-3 | ¡K | n-m | ¡K | 2 | 1 | 0 | multiplier |
| 1 | 0 | 0 | ¡K | 0 | ¡K | 0 | 0 | 0 | $f/(2^1)$ |
| 0 | 1 | 0 | ¡K | 0 | ¡K | 0 | 0 | 0 | $f/(2^2)$ |
| 0 | 0 | 1 | ¡K | 0 | ¡K | 0 | 0 | 0 | $f/(2^3)$ |
| . | . | . | . | . | . | . | . | . | . |
| 0 | 0 | 0 | ¡K | 1 | ¡K | 0 | 0 | 0 | $f/(2^m)$ |
| . | . | . | . | . | . | . | . | . | . |
| 0 | 0 | 0 | ¡K | 0 | ¡K | 1 | 0 | 0 | $f/(2^{n-2})$ |
| 0 | 0 | 0 | ¡K | 0 | ¡K | 0 | 1 | 0 | $f/(2^{n-1})$ |
| 0 | 0 | 0 | ¡K | 0 | ¡K | 0 | 0 | 1 | $f/(2^n)$ |

TABLE 2

Table of the relation of the 7-bit INCR adjustment parameter with the divided frequency multiplier

| adjustment parameter$_i$] INCR$_i$ | divided frequency multiplier |
|---|---|
| 0000000 | 1 |
| 1000000 | 2 |
| 0100000 | 4 |
| 0010000 | 8 |
| 0001000 | 16 |
| 0000100 | 32 |
| 0000010 | 64 |
| 0000001 | 128 |

What is claimed is:

1. A programmable frequency divider used to transform one import clock to one target clock with an import clock having a frequency $2^m$ times as high as that of the target clock wherein m is an integer larger than zero, comprising:
   a) a NOR Gate using remaining bits after the elimination of the most significant bit of an adjustment parameter as a input signal to form one output signal wherein the adjustment parameter contains n bits, n is an integer larger than zero, and m≦n, said adjustment parameter is controlled by program command;
   b) a n-bit adder (n-bit ADD) using a first signal and one return signal to create one first output signal wherein said first signal comprises the one output signal of the NOR Gate and the remaining bits after elimination of the most significant bit of the adjustment parameter, and said output signal is a most significant bit of the first signal;
   c) a n-bit D Flip Flop connected to said n-bit adder to form a cyclic circuit receiving the first output signal and the import clock and generating a second output signal wherein said second output signal comprises a second signal comprising the most significant bit of said second output signal and a return signal comprising n-bits from said second output signal, and said return signal is sent back to said n-bit adder to make addition calculations with said first signal;
   d) a NAND Gate using a first import and a second import to create a fourth output signal wherein said first import receives said output signal, and said second import from a inverse import for receiving the most significant bit of said adjustment parameter;
   e) a second D Flip Flop receiving the fourth output signal and the import clock to create a third signal;
   f) an AND Gate using a third import and a fourth import to create a fifth output signal wherein a third import receives said second signal and said fourth import form the inverse import for receiving said third signal;
   g) a third D Flip Flop receiving the fifth output signal and an inverse import clock to create the fourth signal, said inverse import clock making use of an inverter to inverse output the import clock; and
   h) a XOR Gate using said second signal and said fourth signal to create a target signal wherein said target signal is the basis for the output of the target clock.

2. The programmable frequency divider according to claim 1, wherein said D Flip Flop is triggered by one of a positive edge trigger and a negative edge trigger.

3. The programmable frequency divider according to claim 1, wherein said D Flip Flop comprises at least one AND Gate, at least one OR Gate and at least one inverter.

4. The programmable frequency divider according to claim 1, wherein said adder comprises at least one AND Gate, at least one OR Gate and at least one inverter.

5. The programmable frequency divider according to claim 1, wherein said import clock is an oscillator.

6. A programmable frequency divider used to transform one import clock to one target clock with an import clock having a frequency $2^m$ times as high as that of the target clock wherein m is an integer larger than zero, comprising:
   a) a NOR Gate using the remaining bits after the elimination of the most significant bit of an adjustment parameter as a input signal to form output signal wherein the adjustment parameter contains n bits, n is an integer larger than zero, and m≦n, said adjustment parameter is controlled by program command;
   b) a n-bit adder (n-bit ADD) using first signal and one return signal to create one first output signal wherein said first signal comprises output signal of the NOR Gate and the remaining bits after elimination of the most significant bit of said adjustment parameter and said output signal is a most significant bit of the first signal;
   c) a n-bit first temporary data storage unit said n-bit adder to form a cycle for receiving the first output signal and the import clock and generating a second output signal wherein said second output signal comprises a return signal comprising n-bits from said second output signal and a second signal comprising the most significant bit of said second output signal, and said return signal is sent back to said n-bit adder to make addition calculations with said first signal;
   d) the a NAND Gate using the first import and the second import to create a fourth output signal wherein said first import receives said output signal and said second import form inverse import for receiving the most significant bit of the adjustment parameter;
   e) a second temporary data storage unit receiving the fourth output signal and the import clock to create a third signal;
   f) a AND Gate using the third import and the fourth import to create a fifth output signal wherein said third import receives the second signal and said fourth import form the inverse import for receiving the third signal;
   g) a third D Flip Flop using the fifth output signal and the inverse import clock to create the fourth signal wherein the said inverse import clock make use of an inverter to inverse output the import clock; and
   hf) a XOR Gate using said second signal and said fourth signal to create a target signal wherein said target signal is the basis for the output of the target clock.

7. The programmable frequency divider according to claim 6, wherein said D Flip Flop is triggered by one of a positive edge trigger and a negative edge trigger.

8. The programmable frequency divider according to claim 6, wherein said D Flip Flop comprises at least one AND Gate, at least one OR Gate and at least one inverter.

9. The programmable frequency divider according to claim 6, wherein said adder comprises at least one AND Gate, at least one OR Gate and at least one inverter.

10. The programmable frequency divider according to claim 6, wherein said import clock is an oscillator.

* * * * *